(12) United States Patent
Chen (10) Patent No.: US 7,443,208 B2
(45) Date of Patent: Oct. 28, 2008

(54) PEAK DETECTOR

(75) Inventor: Chun-Chi Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/411,098

(22) Filed: Apr. 26, 2006

(65) Prior Publication Data
US 2007/0126481 A1    Jun. 7, 2007

(30) Foreign Application Priority Data
Dec. 2, 2005   (TW) .............................. 94142680 A (51) Int. Cl.
G01R 19/00 (2006.01)
H03K 5/153 (2006.01)
(52) U.S. Cl. .............................. 327/59; 327/61; 327/73
(58) Field of Classification Search ............ 327/58–62, 327/72–75, 77–80, 81, 87–89
See application file for complete search history.

(56) References Cited

U.S. PATENT DOCUMENTS

| | | | | |
|---|---|---|---|---|
| 5,561,383 A | | 10/1996 | Rogers | |
| 5,978,664 A | * | 11/1999 | Janssen | 455/226.2 |
| 6,064,238 A | * | 5/2000 | Wight et al. | 327/58 |
| 6,429,696 B1 | | 8/2002 | Kao et al. | |
| 6,727,754 B2 | * | 4/2004 | Dupuis et al. | 330/254 |
| 6,999,735 B2 | * | 2/2006 | Khorram | 455/115.1 |
| 7,053,674 B1 | * | 5/2006 | Romero et al. | 327/94 |
| 7,126,384 B2 | * | 10/2006 | Hsu et al. | 327/58 |
| 7,135,892 B2 | * | 11/2006 | Doyle et al. | 327/58 |
| 7,161,392 B2 | * | 1/2007 | Nakamura | 327/58 |
| 2001/0054910 A1 | * | 12/2001 | Gilliam | 324/765 |

* cited by examiner

*Primary Examiner*—Lincoln Donovan
*Assistant Examiner*—Patrick O'Neill
(74) *Attorney, Agent, or Firm*—Rabin & Berdo, P.C.

(57) ABSTRACT

A peak detector is provided. Current switches are utilized and controlled by output of a plurality of error amplifiers respectively, such that charging currents are adjusted for a charge element in response to operations of the current switches respectively. Therefore, the overshooting charge is avoided and the time for charge is optimized.

22 Claims, 9 Drawing Sheets

PEAK DETECTOR

CROSS-REFERENCE TO RELATED APPLICATIONS

This non-provisional application claims priority under 35 U.S.C. § 119(a) on Patent Application No(s). 094142680 filed in Taiwan, R.O.C. on Dec. 2, 2005, the entire contents of which are hereby incorporated by reference.

BACKGROUND OF THE INVENTION

1. Field of Invention

The invention relates a peak detector, in particular to a peak detector used in a receiver to establish a threshold voltage in a swift manner.

2. Related Art

Figure 1:
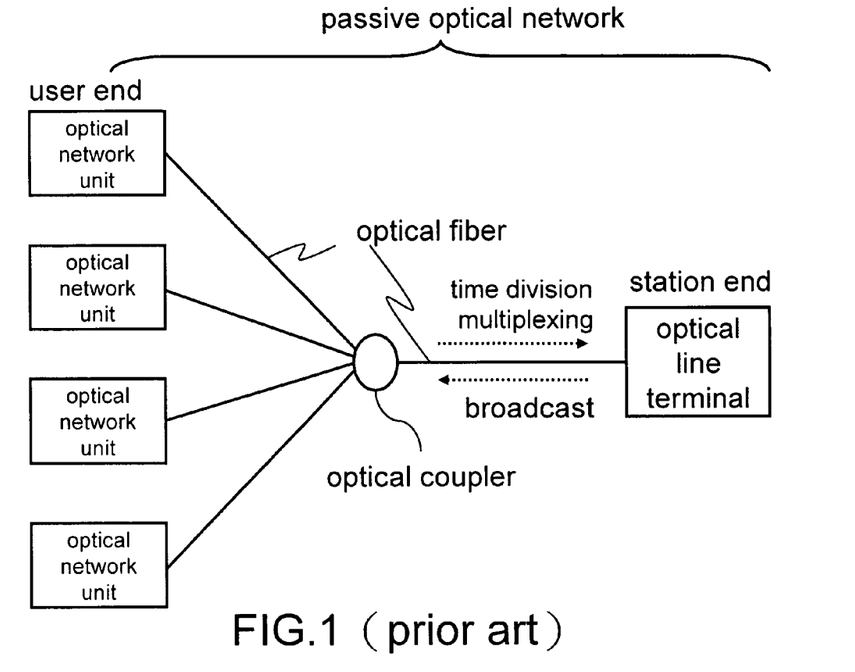
FIG. 1 is a schematic diagram of the system structure of a Passive Optical Network (PON) according to the prior art.

In general, in a passive optical network (PON), a plurality of Optical Network Units (ONU) is provided in the equivalent number of offices or households, and is connected to a single Optical Line Terminal (OLT) through passive devices. Data can be transmitted from an optical line terminal to an optical network unit through broadcasting, which is called down-transmission. Further, data can be transmitted from an optical network unit to an optical line terminal in a time division multiplexing (TDM) manner, which is called up-transmission, as shown in FIG. 1

Figure 2:
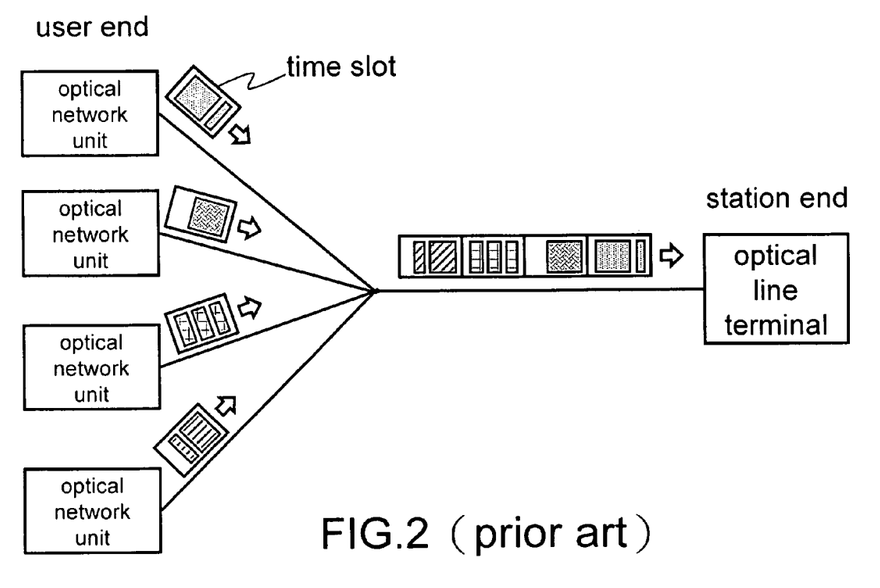
FIG. 2 is a schematic diagram of data up-transmission in a Passive Optical Network (PON) according to the prior art.

In the data up-transmission, each of the optical network units (ONU) is assigned a time slot, and in this time slot, the respective optical line terminal may transmit any number of data packets, as shown in FIG. 2. In other words, each of the user ends is connected to the light wave channel of the station end in a time division multiplexing manner. In data up-transmission, the receiver at the station end is used to receive the light signals from the various user ends.

However, since the powers of light waves transmitted from various user ends are not quite the same, the intensities of the light wave signals reaching the station end are certainly not a constant value after transmitting through various light wave channels. Therefore, in order to raise the efficiency of such time division multiplexing communications, the receiver at the station end must swiftly establish a threshold voltage relative to the light wave intensity transmitted from the respective user end, and convert it into the digital signals of logic "0" and "1" after comparing the analog voltage of the light wave signal with the threshold voltage.

Figure 3:
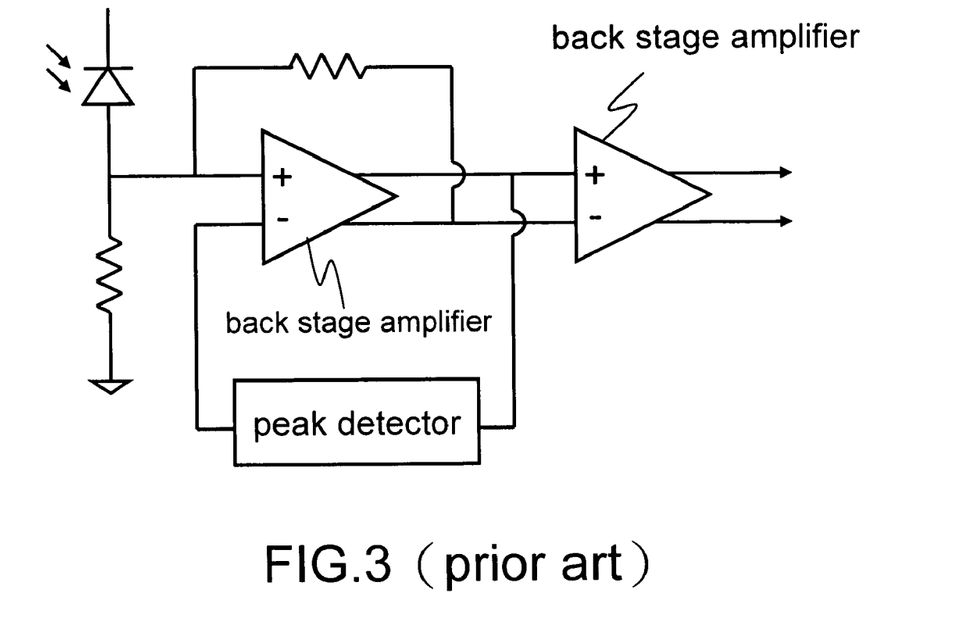
FIG. 3 is a circuit diagram of a receiver according to the prior art.

The peak detector may quickly detect and obtain the peak value of the input signal; therefore, in the passive optical network (PON), a peak detector, during the design of the receiver at the station end, is usually used to generate a threshold voltage, that is used to determine logic "0" or logic "1" of the received light wave signal, as shown in FIG. 3. In application, the inaccuracy of the threshold voltage value could lead to the distortion of the duty-cycle of the output signal of the receiver, which would in turn affect the sensitivity of the receiver. Thus, the design of a peak detector, which is capable of producing an accurate peak value and avoiding overshoot while the input signal is weak, and swiftly producing a peak value while the input signal is strong, is a keynote and essential task in this field.

Figure 4:
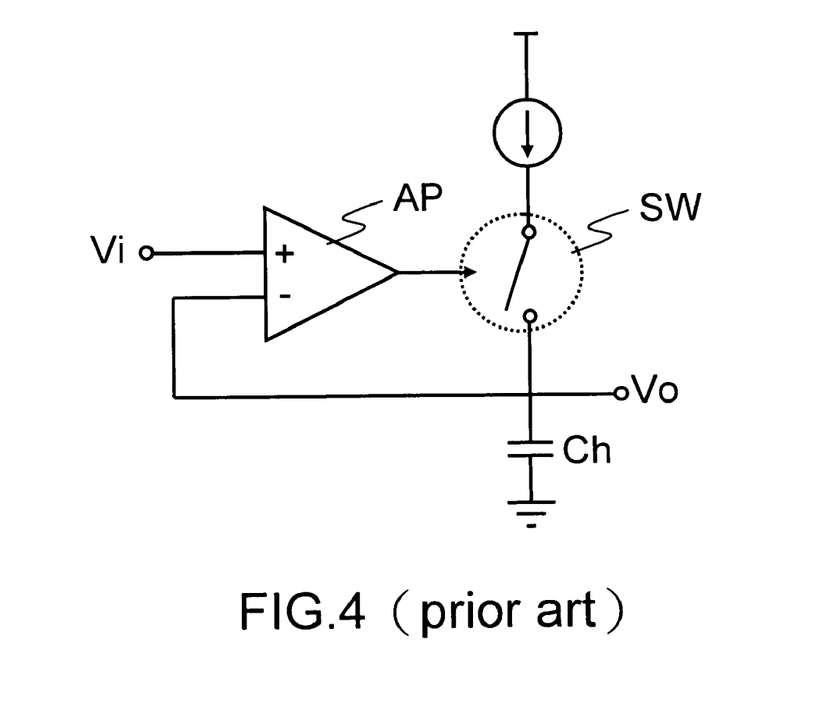
FIG. 4 is a circuit diagram of a peak detector according to the prior art.
Figure 5:
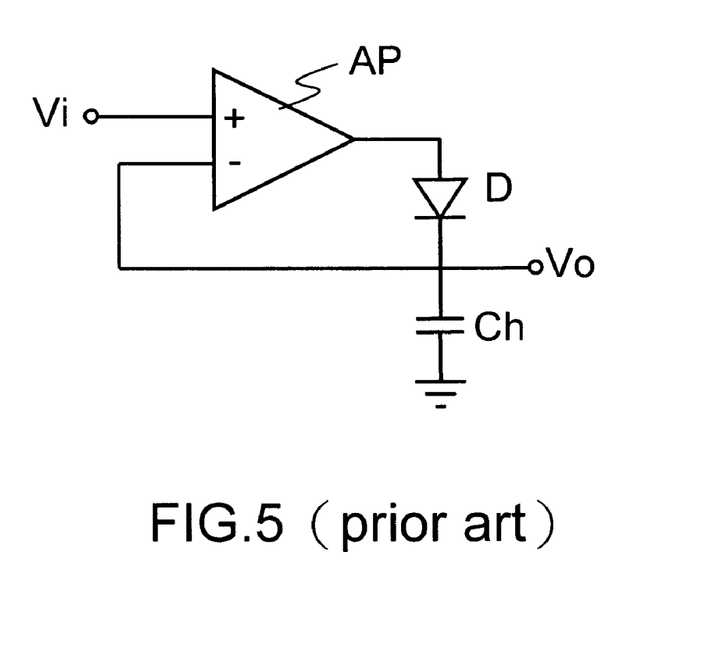
FIG. 5 is a circuit diagram of another peak detector according to the prior art.
Figure 6:
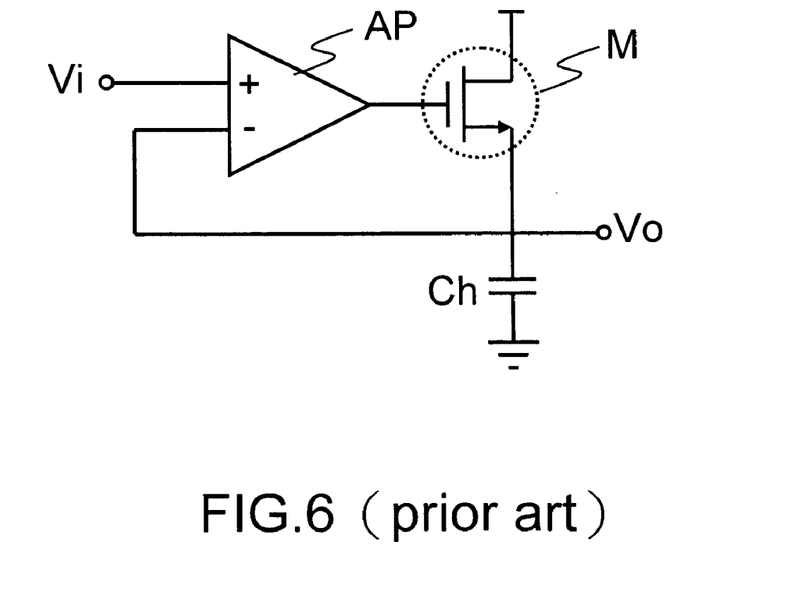
FIG. 6 is a circuit diagram of still another peak detector according to the prior art.

In this respect, refer to FIG. 4 for a more detailed explanation. FIG. 4 is a circuit diagram of a peak detector according to the prior art. As shown in FIG. 4, the voltage difference of an input voltage Vi and output voltage Vo is amplified through an error amplifier AP. When the input voltage Vi is higher than the output voltage Vo, the error amplifier AP outputs a high voltage to turn on the current switch SW, thus charging the capacitor Ch; Conversely, when the input voltage Vi is lower than the output voltage Vo, the current switch SW is turned off, thus the capacitor Ch maintains its peak voltage. In the above description, the current switch may be a diode D (as shown in FIG. 5) or a transistor M (as shown in FIG. 6).

However, in the framework of the prior art, when an optimal peak detector relative to a strong input signal is designed, in order to accelerate the response time of the peak detector, a larger charging current is required. As such, when the input signal is weak, during the process of charging the capacitor to its peak voltage, the current switch can not be turned off in time to cut off the charging current due to the delay of the switch-controlling signal caused by the limited bandwidth of the error amplifier, which in turn results in excessive charging duration, hereby producing an output signal exceeding the peak value. Thus it is evident that if overshoot is to be avoided, then the signal delay of the error amplifier or the charging current must be reduced.

When the high-gain error amplifier is utilized to reduce the impact of the diode or transistor on the threshold voltage for realizing a correct and precise peak detector, since the product of the gain of an element and its bandwidth has a limited range, as such under the condition of not sacrificing the gain of the error amplifier, the signal delay caused by the limited bandwidth of the error amplifier can not be infinitesimally reduced. In addition, if the charging current is reduced, then when the input current is large, the time required to charge the capacitor to its peak voltage will be affected. Therefore, when the scope of variation of the input signal is large, the voltage overshoot of the peak detector and the capacitor charging duration can not both be optimized simultaneously.

SUMMARY OF THE INVENTION

In view of the above-mentioned drawbacks and shortcomings of the prior art, the object of the invention is to provide a peak detector, which can be used to solve the problem that the voltage overshoot of the peak detector and the capacitor charging duration can not both be optimized simultaneously.

Therefore, to achieve the above-mentioned objects, the invention discloses a peak detector, which can be utilized to detect the peak value of an input signal and output a signal based on the input signal, including a plurality of error amplifiers, a plurality of current switches, and a charging element.

In a peak detector, each of the respective error amplifiers is provided with a positive input terminal, a negative input terminal, and an output terminal, with the positive input terminal connected to an input signal, and its negative input terminal connected to an output signal. The charging element is also connected to an output signal. The current switch is connected to a charging element, and is connected to one of a plurality of charging currents. In the above structure, the output terminal of the respective error amplifier is connected to the respective current switch, to control the current switch connected thereto. Thus it is used in turn to determine if the charging current corresponding to the respective current switch is allowed to charge the charging element.

In the above description, while the gain of the respective error amplifier is incrementing, the charging current it controls is decrementing, so that the negative input terminal of the respective error amplifier may have the same potential. In addition, a potential difference may exist between the negative input terminals of the respective error amplifiers.

Moreover, the respective current switch is turned on, when the voltage difference between its input signal and output signal is greater than a predetermined voltage value. In this respect, the value of the predetermined voltage can be obtained by dividing the threshold voltage of the respective current switch by the gain of the error amplifier connected thereto.

The above-mentioned current switch may be a transistor, and the magnitude of the charging current flowing through can be controlled through adjusting the size of the corresponding transistor.

Accordingly, the charging current is provided by a current source. Alternatively, the charging current may be provided by a voltage source in conjunction with an impedance element, thus the magnitude of the charging current can be controlled by adjusting the impedance value of the impedance element. Furthermore, the impedance element may be omitted, and the charging current is provided exclusively by a voltage source.

In addition to the peak detector mentioned above, the invention discloses a peak detector of another varied embodiment, which can be utilized to detect the peak value of an input signal and then output an output signal, including a plurality of error amplifiers, a plurality of diodes, and a charging element.

In such a peak detector, each of the respective error amplifiers is provided with a positive input terminal, a negative input terminal, and an output terminal, with the positive input terminal connected to an input signal, and its negative input terminal connected to an output signal. The charging element is also connected to an output signal, and the respective diode is connected between a charging element and an output terminal of one of the error amplifiers. In the above configuration, the output terminal of the respective error amplifier is connected to the respective diode, thus controlling the diode connected thereto, which is used to determine if the corresponding charging current is allowed to charge the charging element.

In the above description, while the gain of the respective error amplifier is incrementing, the charging current flowing through the diode connected thereto is decrementing, and the magnitude of the charging current can be controlled through adjusting the size of the corresponding diode.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention will become more fully understood from the detailed description given below for illustration only, and thus is not limitative of the present invention, wherein.

DETAILED DESCRIPTION OF THE INVENTION

The purpose, construction, features, and functions of the invention can be appreciated and understood more thoroughly through the following detailed description with reference to the attached drawings.

The object of the invention is to avoid a voltage overshot when the variation of the input signal is large, and to achieve the optimization of the charging time of the capacitor, through charging the capacitor with a plurality of error amplifiers and a plurality of charging currents. The description of the various operation details of the peak detector of the invention is given as follows.

Figure 7:
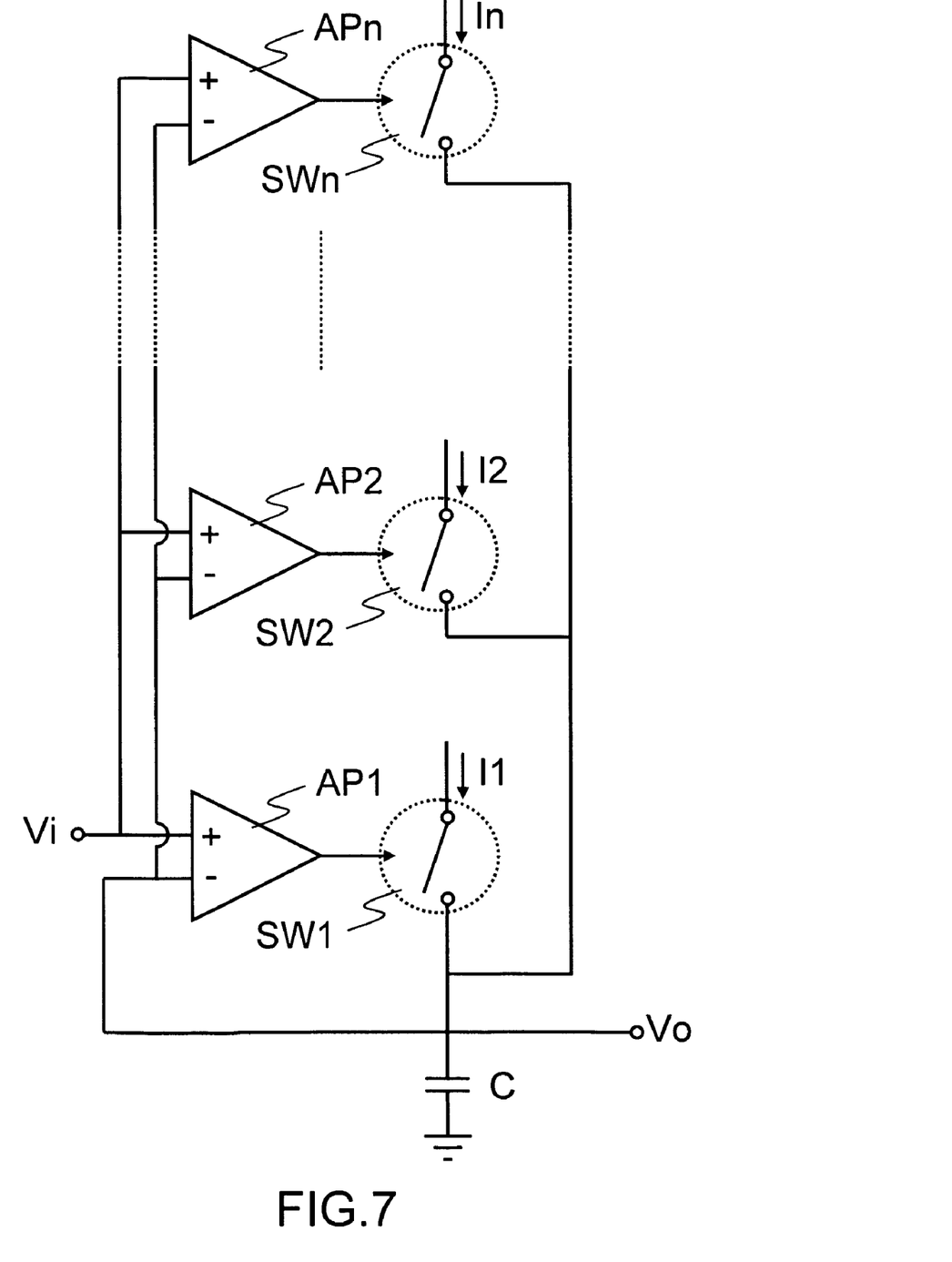
FIG. 7 is a circuit diagram of a peak detector according to the first embodiment of the invention.

Firstly, refer to FIG. 7 for a circuit diagram of a peak detector according to the first embodiment of the invention. As shown in FIG. 7, the peak detector of the invention is composed of: a plurality of error amplifiers AP1, AP2 ... and Apn. Each of the error amplifiers AP1, AP2 ... and APn is provided with a positive input terminal, a negative input terminal, and an output terminal. An input signal Vi is input in the positive terminal of the respective error amplifier AP1, AP2 ... and APn, and its output signal Vo feeds back to the negative terminal of the respective error amplifiers AP1, AP2 ..., and Apn. A charging element, which is connected between the negative input terminal of the respective error amplifiers AP1, AP2 ..., and APn and the ground. Besides, a plurality of current switches SW1,SW2 ..., and SWn, of which each is connected between the respective charging currents I1, I2 ..., and In and the output signal Vo. In the above configuration, the output terminal of each of the respective error amplifiers AP1, AP2, ..., and APn is connected to each of the current switches SW1,SW2 ..., and SWn, thus controlling the respective switch, which in turn is used to determine if the charging current I1, I2 ... and In are allowed to charge the charging element C, where n is a positive integer. While the gain of the respective error amplifier is incrementing, the charging current flowing through the diode connected thereto is decrementing. As such, under various conditions of input signals, different numbers of current switches may be turned on, to charge the charging element as required.

For easy explanation and understanding, a set of two error amplifiers, two current switches, and two charging currents are utilized to describe structure and operation of the peak detector of the invention. However, in practice, three sets, four sets, or even five sets of error amplifiers, current switches, and charging currents may be utilized to realize the peak detector of the invention, depending on the actual requirements.

Figure 8:
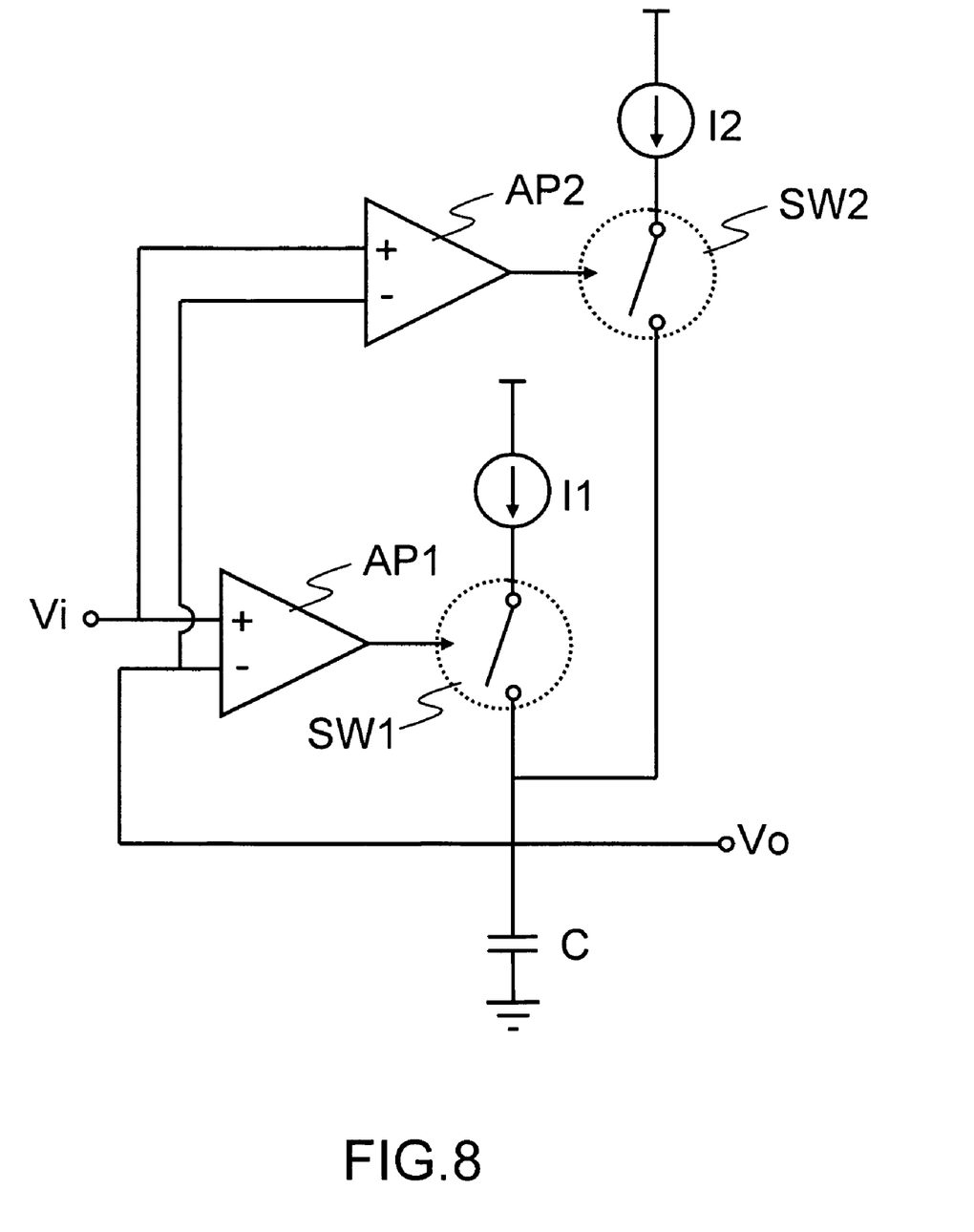
FIG. 8 is a circuit diagram of a peak detector according to the second embodiment of the invention.
Figure 9:
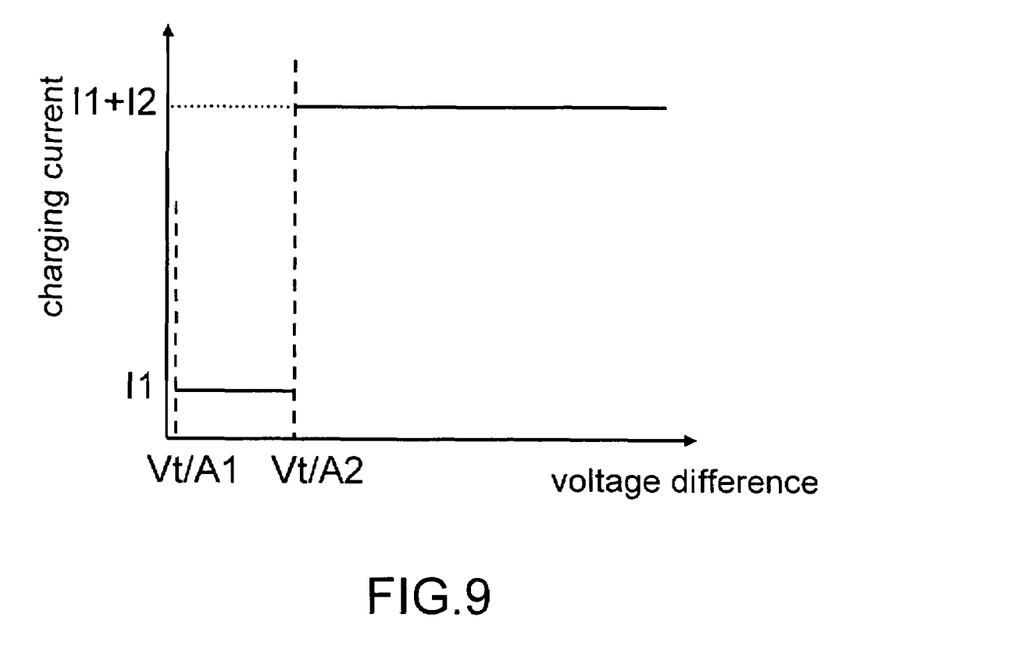
FIG. 9 is a diagram showing the relations of the charging current vs. the voltage difference between input and output signals of an error amplifier.

Next, refer to FIG. 8 for a circuit diagram of a peak detector according to the second embodiment of the invention. As shown in FIG. 8, the peak detector of the invention is composed of: two error amplifiers AP1, AP2, two current switches SW1, SW2, and a charging element C. Each of the error amplifiers AP1, AP2 is provided with a positive input terminal, a negative input terminal, and an output terminal. An input signal Vi is input in the positive terminals of the respective error amplifiers AP1, AP2, and its output signal Vo feeds back to the negative input terminals of the respective error amplifiers AP1, AP2. The output terminals of the error amplifiers AP1 and AP2 are connected to the control terminals of the current switches SW1 and SW2 respectively. In addition, the current switches SW1 and SW2 are used to connect the charging currents I1 and I2 to the output signal Vo, and a charging capacitor C is connected between the output signal Vo and the ground. In the above design it is configured that the gain of error amplifier AP1 is greater than that of error amplifier AP2, while the charging current I1 is less than the charging current I2. Furthermore, the relations of the charging currents I1 and I2 vs. the voltage difference of input signal Vi and output signal Vo is as shown in FIG. 9. As shown in FIG. 9, when the voltage difference is between Vt/A1 and Vt/A2 (wherein Vt is the threshold voltage of the current switch, A1 is the gain of an error amplifier AP1, and A2 is the gain of another error amplifier AP2), the output of the error amplifier AP2 is not sufficient to turn on the current switch SW2. Therefore, at this time, the smaller charging current I1 is used to charge the charging element C. Since the charging current I1 is smaller, the voltage overshot phenomenon is reduced. When the voltage difference of the input signal Vi and output signal Vo is greater than Vt/A2, then both switches SW1 and SW2 are turned on, as such obtaining a larger charging current I1+I2. In turn, this reduces the time required to charge the charging element C to its peak voltage.

Figure 10:
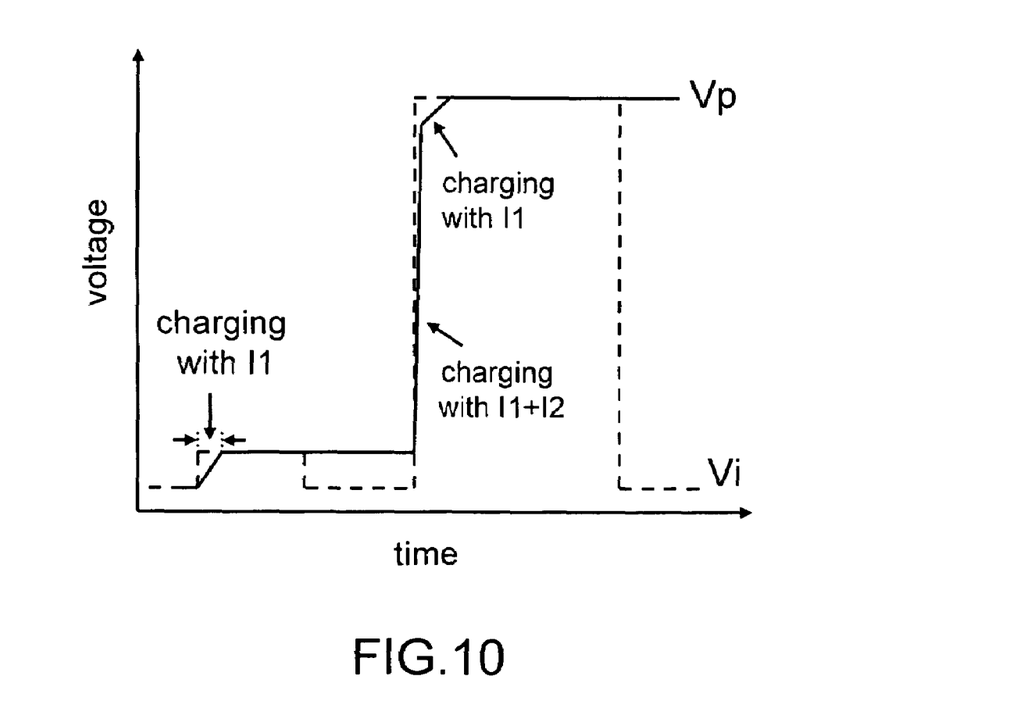
FIG. 10 is a diagram of voltage vs. time, indicating the variations of an input voltage Vi and output voltage Vp in the operation process of a peak detector of the invention.

Then, refer to FIG. 10 for a more detailed description of the operation of the peak detector. As shown in FIG. 10, supposing that at the beginning the input signal Vi is relatively weak, and then it gradually becomes strong. Thus, when the input signal Vi is weak, the gain A2 of the error amplifier AP2 is correspondingly small; hereby it is not sufficient to turn on the current switch SW2. At this time, the charging element C is mainly charged by the relatively lower charging current I1, hereby avoiding a voltage overshoot. When the input signal Vi becomes stronger, since the voltage difference between input signal Vi and the charging element C (namely, the voltage difference between input signal Vi and output signal Vo) is greater than Vt/A2, the charging element C is charged by the relatively high charging current I2 and the relatively low charging current I1, as such obtaining faster charging speed of the charging element. When the voltage across the charging element C increases to a level in which the voltage difference between the input signal Vi and charging element C is less than Vt/A2, then the current switch SW2 is turned off. At this time, the voltage across the charging element is only Vt/A2 lower than its peak value, so that the current switch SW1 is turned on continuously. Thus the relatively low charging current I1 is used to charge the charging element C continuously, until the voltage across the charging element C reaches its peak value Vp. In the above description, the charging element could be a capacitor.

Figure 11:
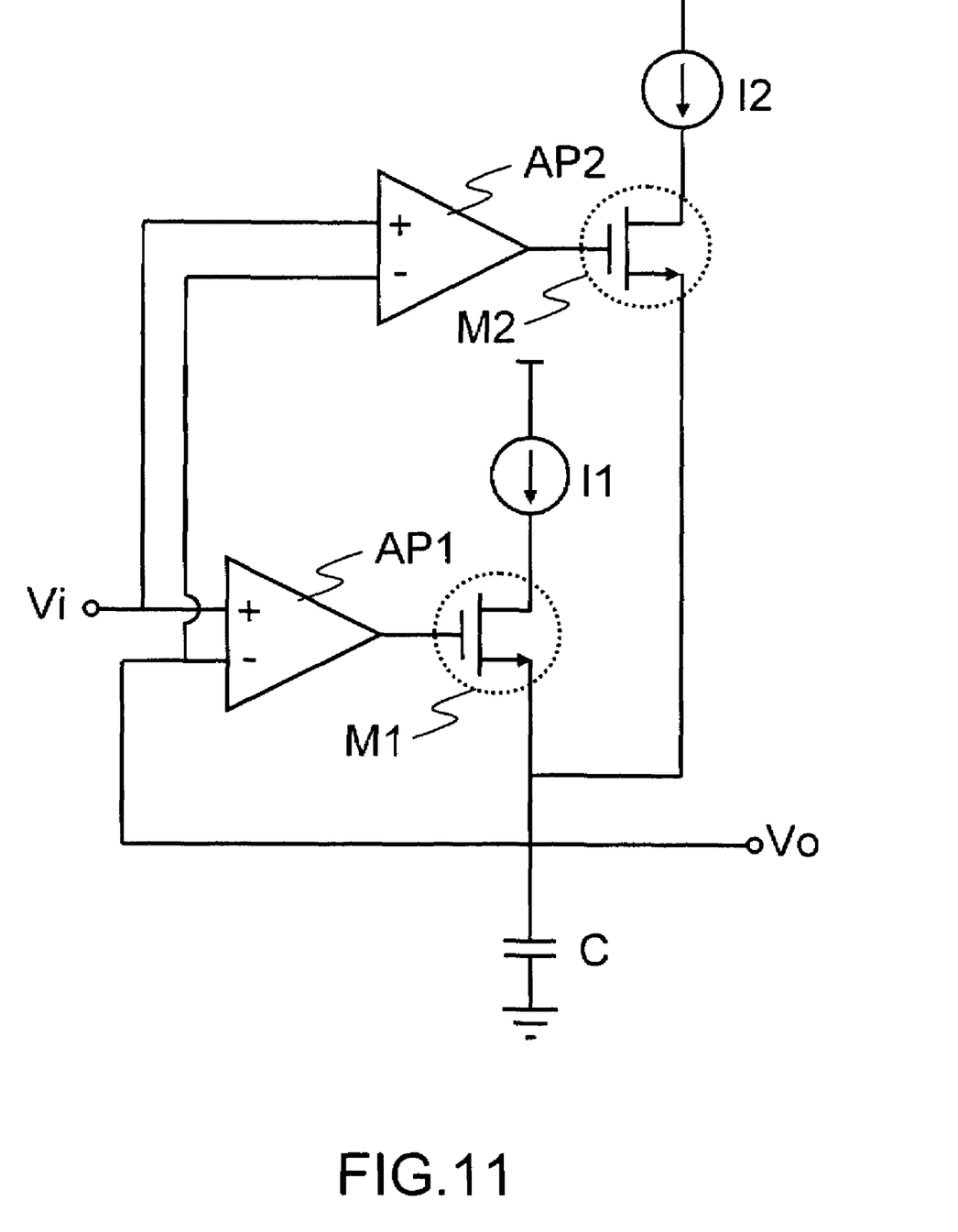
FIG. 11 is a circuit diagram of a peak detector according to the third embodiment of the invention.

Moreover, refer to FIG. 11 for a circuit diagram of a peak detector according to the third embodiment of the invention. The current switch utilized in the embodiment is a transistor, which can be a bipolar junction transistor (BJT), a metal-oxide-semiconductor field effect transistor (MOSFET), or a junction field effect transistor (JFET), etc. As shown in FIG. 11, the output terminal of the error amplifier AP1 is connected to the gate of a first transistor M1, the output terminal of the error amplifier AP2 is connected to the gate of a second transistor M2, the sources of the first transistor M1 and the source of the second transistor M2 are connected to a charging element C. The drains of the first transistor M1 and the drain of the second transistor M2 are connected to a current source respectively, so that when the transistors are turned on, they provide charging currents I1 and I2 respectively to charge the charging element C.

Figure 12:
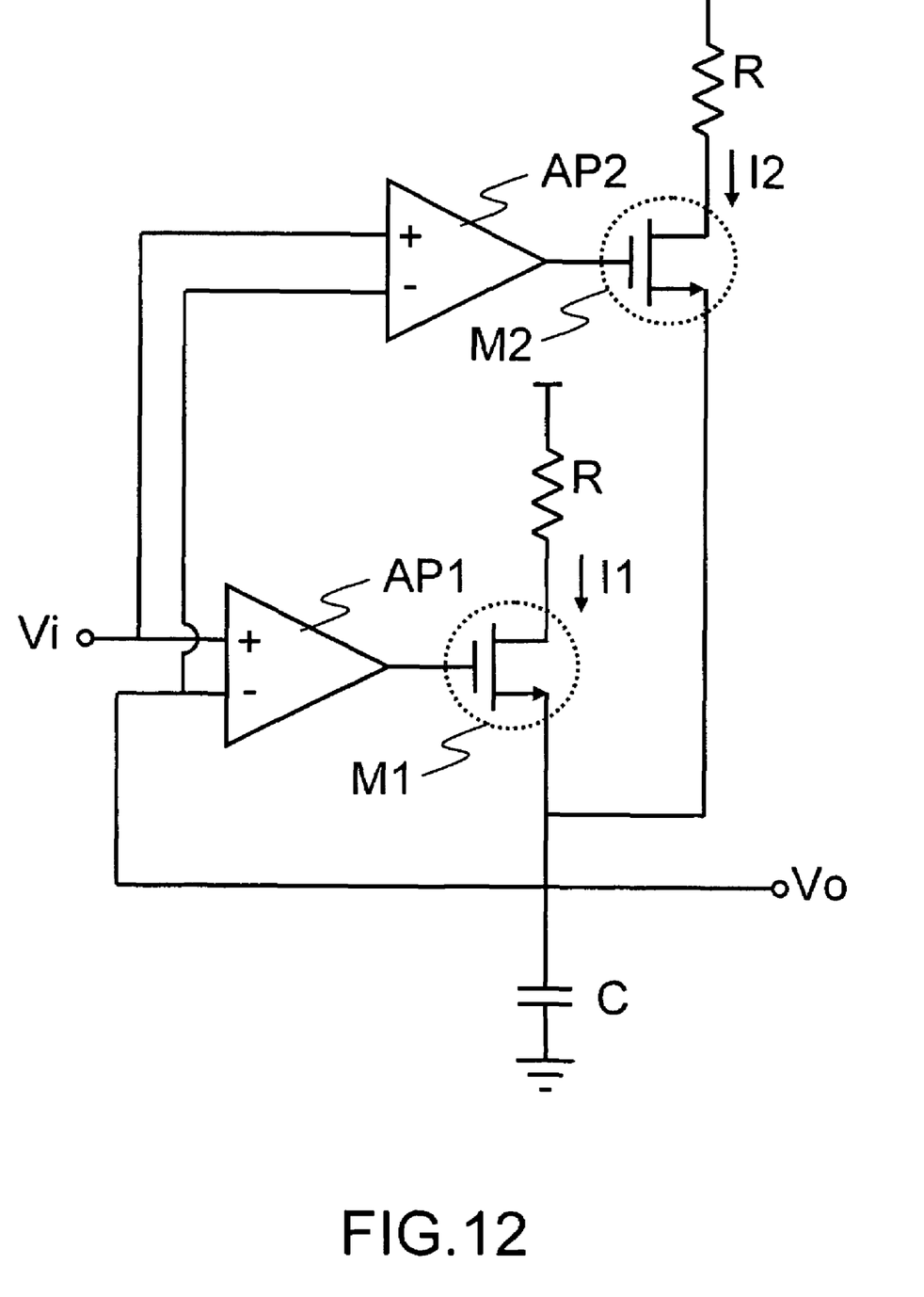
FIG. 12 is a circuit diagram of a peak detector according to the fourth embodiment of the invention.

In addition, as shown in FIG. 12, the charging current can be provided by a voltage source and an impedance element R. In this embodiment, the charging currents I1 and I2, flowing through the current switches, can be controlled by adjusting the size of the transistors M1 and M2 and/or the impedance value of the impedance element R. The impedance element can be a resistor.

Figure 13:
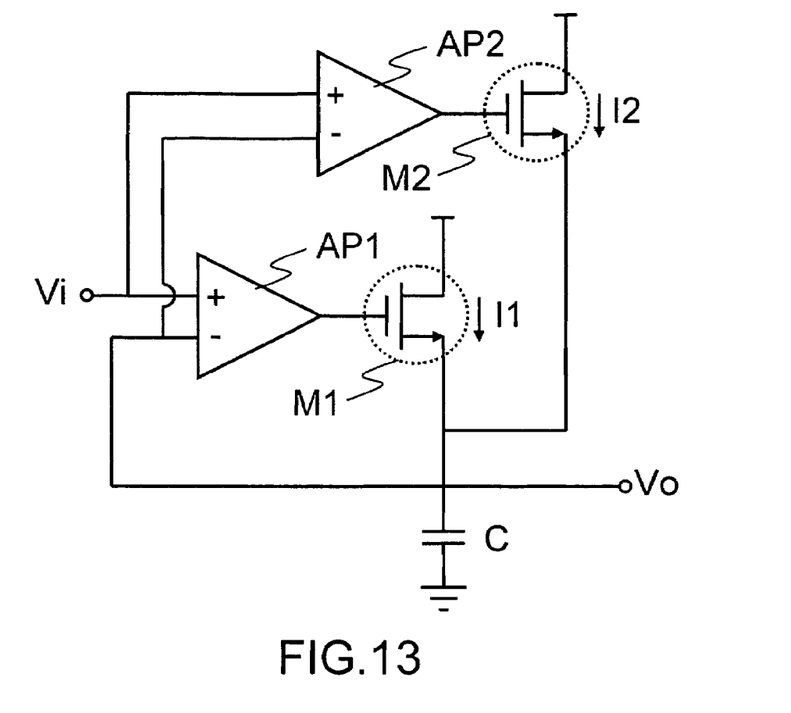
FIG. 13 is a circuit diagram of a peak detector according to the fifth embodiment of the invention.

Moreover, in the fifth embodiment of the invention as shown in FIG. 13, the impedance element R may be omitted, the charging currents I1 and I2, flowing through the current switches, can be controlled by adjusting the size of the transistors M1 and M2.

Figure 14:
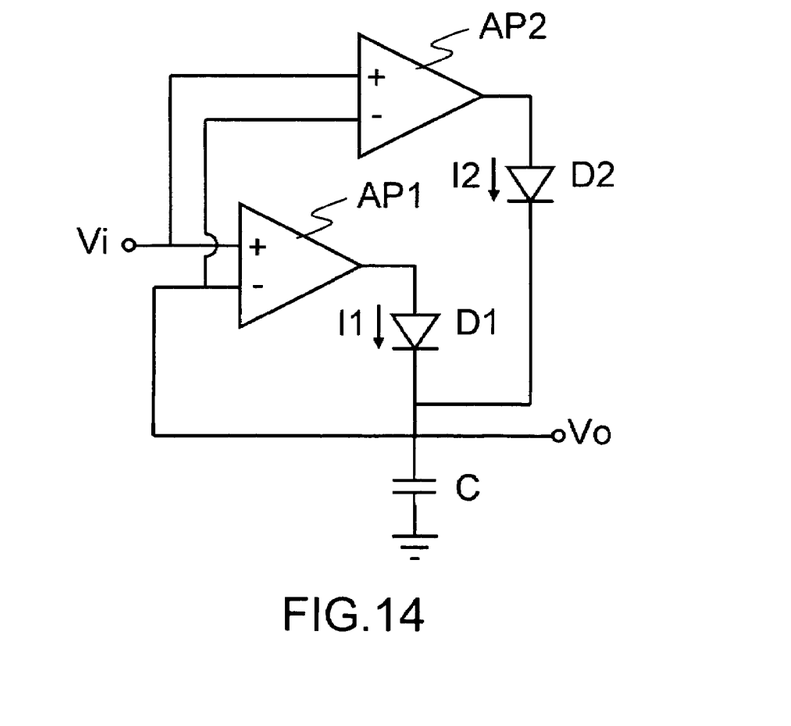
FIG. 14 is a circuit diagram of a peak detector according to the sixth embodiment of the invention.

Furthermore, the current switches utilized may be the diodes D1 and D2, and the charging currents I1 and I2 are provided by the error amplifiers AP1 and AP2 as shown FIG. 14. Similarly, in the above design it is configured that the gain of the error amplifier AP1 is greater than that of the error amplifier AP2, so that the charging current I1 flowing through the diode D1 is lower than the charging current I2 flowing through the diode D2. As such, the magnitude of the charging current can be controlled by adjusting the size of the diode and the output current of the error amplifier. The diode utilized above can be a BJT, MOSFET, or JFET.

Summing up the above, in the invention, the input offset of the additionally provided error amplifier is utilized, so that the relatively high charging current is utilized to charge the charging element only when the voltage difference is large, thus achieving the object of speeding up the charging process.

Knowing the invention thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A peak detector, used to detect the peak value of an input signal that is received at an input terminal of the peak detector and to output an output signal, comprising:
   a plurality of error amplifiers, each of said error amplifiers being provided with a positive input terminal, a negative input terminal, and an output terminal, said respective positive input terminals being connected directly to said input terminal of said peak detector to receive said input signal and said respective negative input terminals receiving said output signal;
   a charging element, connected to said negative input terminals; and
   a plurality of current switches, each being connected to said charging element and to the output terminal of a respective one of said error amplifiers,
wherein said error amplifiers control said current switches and thereby determine whether each of said charging currents is allowed to charge the charging element.

2. The peak detector as claimed in claim 1, wherein the gains of said respective error amplifiers are different from one another, wherein said respective charging currents controlled by said respective error amplifiers are different from one another, and wherein the higher the gain of a particular one of said error amplifiers, the lower the charging current that is controlled by the particular one of said error amplifiers.

3. The peak detector as claimed in claim 1, wherein said respective charging currents are provided by current sources.

4. The peak detector as claimed in claim 1, wherein said respective charging currents are provided by a voltage source.

5. The peak detector as claimed in claim 1, wherein said respective charging currents are provided by a voltage source and impedance elements.

6. The peak detector as claimed in claim 5, wherein said respective charging currents are controlled by the impedance values of said impedance elements.

7. The peak detector as claimed in claim 1, wherein said negative input terminals of said respective error amplifiers are of the same potential.

8. The peak detector as claimed in claim 1, wherein each of said respective current switches is in an on state when the voltage difference between said input signal and said output signal exceeds a predetermined voltage.

9. The peak detector as claimed in claim 8, wherein said predetermined voltage is obtained by dividing the threshold voltage of said respective current switch by the gain of said respective error amplifier.

10. The peak detector as claimed in claim 1, wherein said charging element has a terminal that is connected to the ground.

11. The peak detector as claimed in claim 1, wherein said current switches are transistors.

12. The peak detector as claimed in claim 11, wherein said respective charging currents are controlled by the sizes of said respective transistors.

13. The peak detector as claimed in claim 11, wherein said transistors are metal-oxide-semiconductor field effect transistors (MOSFETs).

14. A peak detector, used to detect the peak value of an input signal that is received at an input terminal of the peak detector and to output an output signal, comprising:
    a plurality of error amplifiers, each of said respective error amplifiers being provided with a positive input terminal, a negative input terminal, and an output terminal, said respective positive input terminals being connected directly to said input terminal of said peak detector to receive said input signal and said respective negative input terminals receiving said output signal;
    a charging element, connected to said negative input terminals; and
    a plurality of diodes, connected to said charging element and said output terminals of said respective error amplifiers,
    wherein said output terminals of said respective error amplifiers are used to control said respective diodes connected thereto, and the diodes are in turn used to determine whether to charge said charging element.

15. The peak detector as claimed in claim 14, wherein the gains of said respective error amplifiers are different from one another, wherein said charging currents flowing through said respective diodes are different from one another, and wherein the higher the gain of a particular one of the error amplifiers, the lower the charging current flowing through the diode that is connected to the particular one of the error amplifiers.

16. The peak detector as claimed in claim 14, wherein said charging current is controlled by adjusting the size of said diode.

17. The peak detector as claimed in claim 14, wherein said charging element has a terminal that is connected to the ground.

18. A peak detector, used to detect the peak value of an input signal, comprising:
    an input terminal that receives the input signal;
    an output terminal;
    a plurality of switches, each having a current input terminal that receives one of a plurality of charging currents with different magnitudes, each switch additionally having a control terminal and a current output terminal, the current output terminals of the switches being connected to the output terminal of the peak detector;
    a capacitor having a terminal that is connected to the output terminal of the peak detector and having another terminal that is connected to ground; and
    a plurality of control components to control the switches, each of the control components having a first input terminal that is connected directly to the input terminal of the peak detector, a second input terminal that is connected directly to the output terminal of the peak detector, and an output terminal that outputs a signal that is a function of the difference between the potential at the first and second input terminals, the output terminal being connected directly to the control terminal of a respective one of the switches.

19. The peak detector as claimed in claim 18, wherein the control components are amplifiers.

20. The peak detector as claimed in claim 19, wherein the amplifiers have gains that are different from one another.

21. The peak detector as claimed in claim 18, wherein the first input terminals of the control components are positive input terminals and the second input terminals of the control components are negative input terminals.

22. The peak detector as claimed in claim 18, wherein the switches are transistors.

* * * * *